(12) United States Patent
In et al.

(10) Patent No.: US 6,990,617 B2
(45) Date of Patent: Jan. 24, 2006

(54) SEMICONDUCTOR MEMORY DEVICE AND TEST METHOD OF THE SAME

(75) Inventors: Sung-Hwan In, Seoul (KR); Hong-Beom Kim, Suwon (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 228 days.

(21) Appl. No.: 10/685,154

(22) Filed: Oct. 14, 2003

(65) Prior Publication Data

US 2004/0090837 A1  May 13, 2004

(30) Foreign Application Priority Data

Nov. 7, 2002  (KR) ..................... 10-2002-0068931

(51) Int. Cl.
*G06F 11/00* (2006.01)

(52) U.S. Cl. ........................ 714/718; 365/201; 710/36

(58) Field of Classification Search ........ 365/201–214, 365/230.01, 230.03, 189.07; 710/16, 36–45, 710/52, 65; 714/718–745; 712/22; 345/564; 711/1, 5, 105, 202
See application file for complete search history.

(56) References Cited

U.S. PATENT DOCUMENTS

| | | | | |
|---|---|---|---|---|
| 5,406,566 A | * | 4/1995 | Obara | 714/719 |
| 5,606,568 A | * | 2/1997 | Sudweeks | 714/729 |
| 5,805,609 A | * | 9/1998 | Mote, Jr. | 714/726 |
| 5,930,814 A | * | 7/1999 | Lepejian et al. | 711/1 |
| 5,970,073 A | * | 10/1999 | Masuda et al. | 714/738 |
| 5,974,579 A | * | 10/1999 | Lepejian et al. | 714/733 |
| 6,134,161 A | * | 10/2000 | Taniguchi et al. | 365/201 |
| 6,671,836 B1 | * | 12/2003 | Lai et al. | 714/718 |
| 2002/0152351 A1 | * | 10/2002 | Tanaka | 711/105 |

* cited by examiner

*Primary Examiner*—Christohper Shin
(74) *Attorney, Agent, or Firm*—F.Chau & Associates, LLC

(57) ABSTRACT

A semiconductor memory device comprises: a write data controller for receiving predetermined bits of data inputted through data input/output pins to generate plural bits of data, and a read data controller for serially converting the plural bits of data to generate serially converted data through one of the data input/output pins during a test operation; and the write data controller for receiving plural bits of data inputted through the input/output pins to generate the plural bits of data, and the read data controller for receiving the plural bits of data to generate the plural bits of data through the data input/output pins during a regular operation, wherein the number of the plural bits is N times the number of the predetermined bits. N being a natural number.

17 Claims, 5 Drawing Sheets

SEMICONDUCTOR MEMORY DEVICE AND TEST METHOD OF THE SAME

BACKGROUND OF INVENTION

1. Field of the Invention

The present invention relates to a semiconductor memory device, more particularly to a semiconductor memory device having reduced number of pins used for testing.

2. Description of Related Art

In response to a write command applied from a tester, a conventional semiconductor device writes data to a memory cell. Then, in response to a read command from the memory cell, the semiconductor device reads the data. The memory cell is considered as normal when write data is the same as read data and is considered as abnormal when write data is different from read data.

When the test is performed by the method described above, there is a limited number of semiconductor memory devices which can be tested in parallel. For example, if the number of input/output (I/O) pins (or pads) of the tester is sixty four (64) and the number of data I/O pins of the semiconductor memory device to be tested is eight, then only eight semiconductor memory devices can be tested because one semiconductor memory device occupies eight I/O pins of the tester. More details are explained below with reference to FIG. 1.

To increase the number of semiconductor memory devices that can be tested in parallel, a parallel bit test technique has been proposed. The parallel bit test technique includes an additional circuit in a semiconductor chip and receives or outputs data not through all data I/O pins but through a predetermined number of data I/O pins. Data inputted through a predetermined number of data I/O pins are multiplexed by the additional circuit in the semiconductor chip, and the multiplexed data is written to a memory cell. Comparison result signals are generated by comparing two bits of data outputted from the memory cell. The comparison result signals are outputted through a predetermined number of data I/O pins.

Even though the parallel bit test may increase the number of the semiconductor memory devices to be tested, test results can be unreliable because the comparison result signal is generated by comparing data by two bits. A comparison result may indicate that the memory cell is normal even if the compared 2-bit data are abnormal. More details are explained below with reference to FIG. 2.

A need therefore exists for a semiconductor memory device which reduces the number of pins used for a test and has a high reliability on the test.

SUMMARY OF THE INVENTION

A semiconductor memory device comprises: a write data controller for receiving predetermined bits of data inputted through data input/output pins to generate plural bits of data, and a read data controller for serially converting the plural bits of data to generate serially converted data through one of the data input/output pins during a test operation; and the write data controller for receiving plural bits of data inputted through the input/output pins to generate the plural bits of data, and the read data controller for receiving the plural bits of data to generate the plural bits of data through the data input/output pins during a regular operation, wherein the number of the plural bits is N times the number of the predetermined bits, N being a natural number.

Preferably, the predetermined bits are four bits and the plural bits are 16 bits.

Alternatively, the read data control circuit is a double data rate (DDR) semiconductor memory device.

According to another aspect of the present invention, a semiconductor memory device comprises: a write data controller for receiving n bits of data inputted through data input/output pins to generate n times k bits of data, and a read data controller for serially converting the n times k bits of data by to generate k bits of data to one of the data input/output pins in sequence during a test operation; and the write data controller for receiving n times k bits of data inputted through data input/output pins to generate the n times k bits of data, and the read data controller for receiving the n times k bits of data to generate n times k bits of data through the data input/output pins during a regular operation, wherein n and k are natural numbers.

According to further aspect of the present invention, a method of testing a semiconductor memory device comprises: extending n bits of data inputted through data input/output pins to generate n times k bits of data, writing the n times k bits of data to a memory cell array, reading the n times k bits of data stored in the memory cell array, and serially converting the n times k bits of data to generate k bits of data, and outputting the k bits of data through one of the data input/output pins during a test operation; and receiving n times k bits of buffered data inputted through data input/output pins to generate n times k bits of data, writing the n times k bits of data to a memory cell array, reading the n times k bits of data stored in the memory cell array, and receiving the n times k bits of data to generate n times k bits of data, and outputting the n times k bits of data through data input/output pins during a regular operation, wherein n and k are natural numbers.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFFERED EMBODIMENTS

The present invention now will be described more fully hereinafter with reference to the accompanying drawings, in which preferred embodiments of the inventions are shown. This invention, however, be embodied in many different forms and should not be construed as limited to the embodiments set forth herein.

The semiconductor memory device according to embodiments of the present invention will be described with reference to the drawings.

Figure 1:
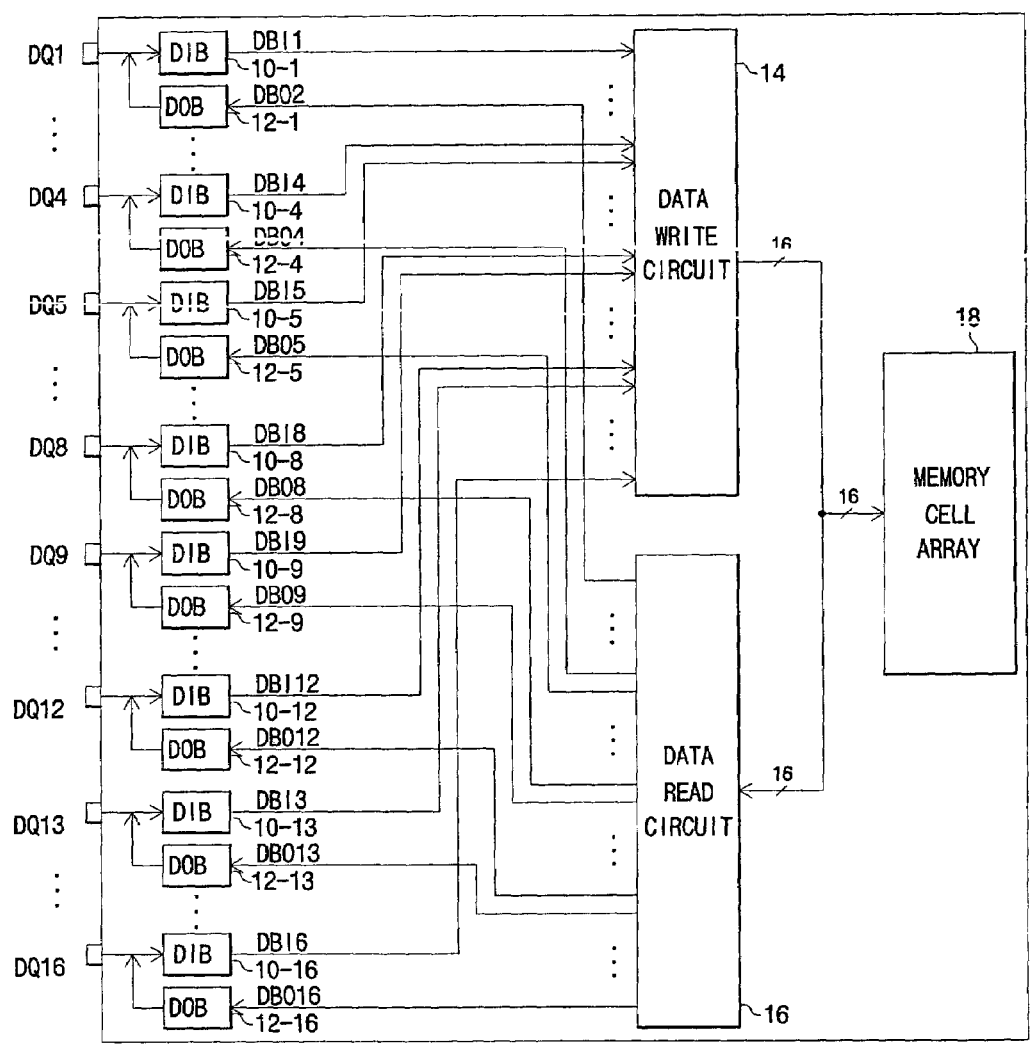
FIG. 1 is a block diagram illustrating a conventional semiconductor memory device.

FIG. 1 is a block diagram illustrating a conventional semiconductor memory device. The semiconductor memory device includes data I/O pins DQ 1 to DQ 16, data input buffers DIBs 10-1 to 10-16, data output buffers DOBs 12-1 to 12-16, data write circuit 14, a data read circuit 16, and a memory cell array 18.

Each of the data input buffers DIBs 10-1 to 10-16 buffers data inputted from the data I/O pins DQ1 to DQ16 to generate buffered input data DBI1 to DBI16. Each of the data output buffers DOBs 12-1 to 12-16 buffers data DBO1 to DBO16 outputted from the data read circuit 16 and outputs DBO1 to DBO16 to the data I/O pins DQ1 to DQ16. The data write circuit 14 receives the buffered input data DBI1 to DBI16 and outputs them to the memory cell array 18. The data read circuit 16 processes data outputted from the memory cell array 18 and outputs the data DBO1 to DBO16 to the data output buffers DOBs 12-1 to 12-16. The memory cell array 18 stores data outputted from the data write circuit 14 during a write operation and outputs data stored in the memory cell array 18 to the data read circuit 16 during a read operation.

The semiconductor memory device of FIG. 1 is configured to input and output data through sixteen data I/O pins DQ1 to DQ16. Therefore, when a tester has 128 I/O pins, the number of semiconductor memory devices that can be tested at the same time is restricted to eight because one semiconductor memory device occupies sixteen I/O pins of the tester.

Figure 2:
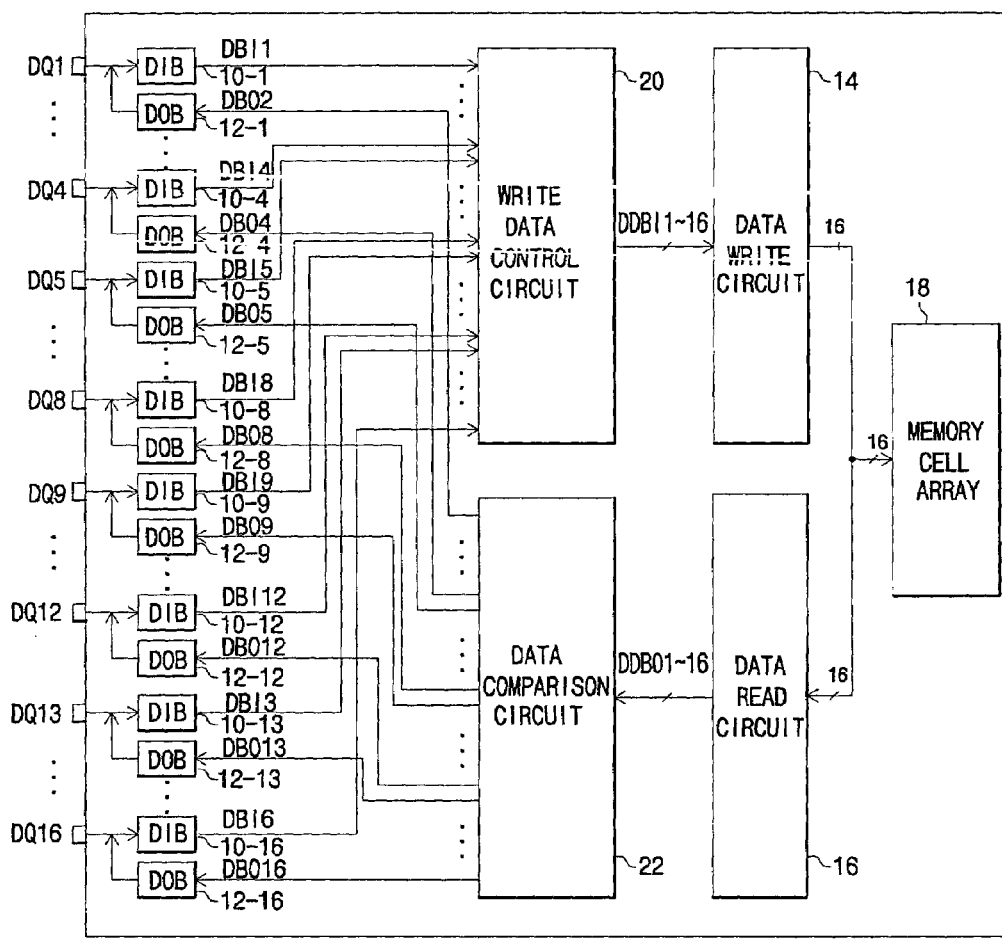
FIG. 2 is a block diagram illustrating another conventional semiconductor memory device.

FIG. 2 is a block diagram illustrating another conventional semiconductor memory device. The semiconductor memory device of FIG. 2 includes a write data control circuit 20 and a data comparison circuit 22 in addition to a configuration of the semiconductor memory device of FIG. 1. Since the same components in FIGS. 1 and 2 function as the same operation, operation of the semiconductor memory device of FIG. 2 will be easily understood with reference to that of FIG. 1.

During a test write operation, the write data control circuit 20 receives buffered input data DBI1, DBI5; DBI9: and DBI13 outputted from the data input buffers DIBs 10-1, 10-5, 10-9, and 10-13 to generate 16-bit data DDBI1 to DDBI16. During a regular write operation, the write data control circuit 20 receives buffered input data DBI1 to DBI16 outputted from the data input buffers DIBs 10-1 to 10-16 to generate 16-bit data DDB1 to DDB16.

During a test read operation, the data comparison circuit 22 compares data DDBO1 to DDBO16 outputted from the data read circuit 16 by two bits to generate a 8-bit data, and then compares the 8-bit data by two bits to generate a 4-bit comparison. During a regular read operation, the data comparison circuit 22 receives data DDBO1 to DDBO16 outputted from the data read circuit 16 and outputs DDBO1 to DDBO16 to the data output buffers DOBs 12-1 to 12-16.

The conventional semiconductor memory device of FIG. 2 is configured to receive or output data through four data I/O pins DQ1, DQ5, DQ9, and DQ13 during a test operation. Therefore, when a tester has 128 I/O pins, the number of semiconductor memory devices that can be tested at the same time is thirty two because one semiconductor memory device occupies four I/O pins of the tester. That is, the number of the semiconductor memory device to be tested by the tester is not restricted by the number of the data I/O pins. Therefore, the number of the semiconductor memory devices that can be tested at the same time is increased compared to that of FIG. 1.

The data comparison circuit 22 of the semiconductor memory device of FIG. 2 compares the data outputted from the data read circuit 16 by two bits to generate a comparison result signal. The comparison result signal indicates normally when the two bits of data are the same and indicates abnormality when the two bits of data are different. However, there is a problem in that, when both of the two bits of data are "0" and "0" and there are errors in both bits, the comparator may erroneously indicate a normal result.

Therefore, even though the number of the semiconductor memory device to be tested at the same time is increased, an incorrect comparison result signal can be generated.

Figure 3:
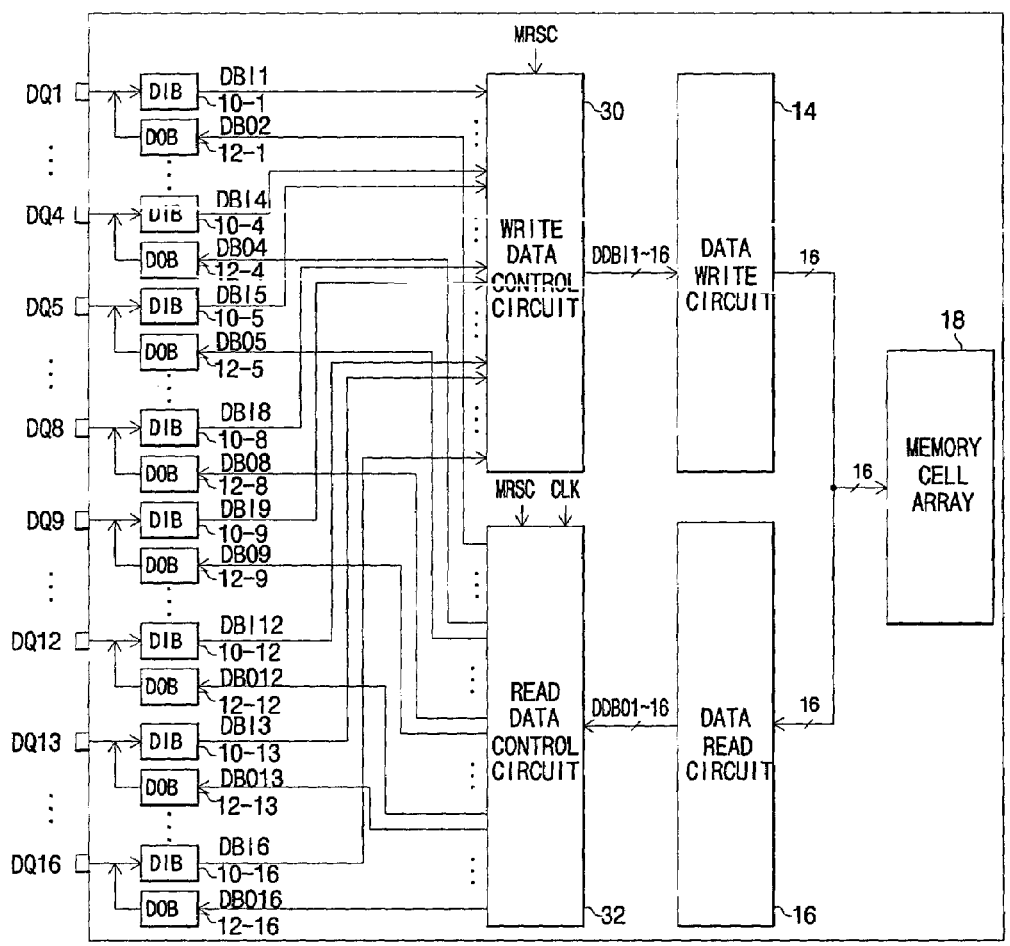
FIG. 3 is a block diagram illustrating a semiconductor memory device according to an embodiment of the present invention.

FIG. 3 is a block diagram illustrating a semiconductor memory device according to an embodiment of the present invention. The semiconductor memory device of FIG. 3 includes a write data control circuit 30 and a read data control circuit 32 in addition to a configuration of the semiconductor memory device of FIG. 1. Since the same components in FIGS. 1 and 3 function as the same operation, operation of the semiconductor memory device of FIG. 3 will be easily understood with reference to FIG. 1.

During a test write operation, the write data control circuit 30 extends buffered input data DBI1, DBI5, DBI9, and DBI13 outputted from the data input buffers DIBs 10-1, 10-5, 10-9, and 10-13 to generate 16-bit data DDBI1 to DDBI16 in response to a test control signal MRSC. During a regular write operation, the write data control circuit 30 receives buffered input data DBI1 to DBI16 outputted from the data input buffers DIBs 10-1 to 10-16 to generate 16-bit data DDBI1 to DDBI16.

During a test read operation, the read data control circuit 32 serially converts data DDBO1 to DDBO16, by four bits, outputted in parallel from the data read circuit 16 in response to the test control signal MRSC and a clock signal CLK. The read data control circuit 32 outputs data DDBO1 to DDBO16 to the data output buffers DOBs 12-1, 12-5, 12-9, and 12-13 in sequence. During a regular read operation, the read data control circuit 32 receives data DDBO1 to DDBO16 outputted from the data read circuit 16 to generate buffered output data DBO1 to DBO16 to the data output buffers DOBs 12-1 to 12-16.

In FIG. 3, the test control signal MRSC is set by inputting a mode setting code corresponding to the test control signal MRSC to a mode setting register (not shown) during a mode setting operation. Since such an operation is well known, description of such an operation is omitted. The clock signal CLK is a signal which is externally inputted or internally generated.

Figure 4:
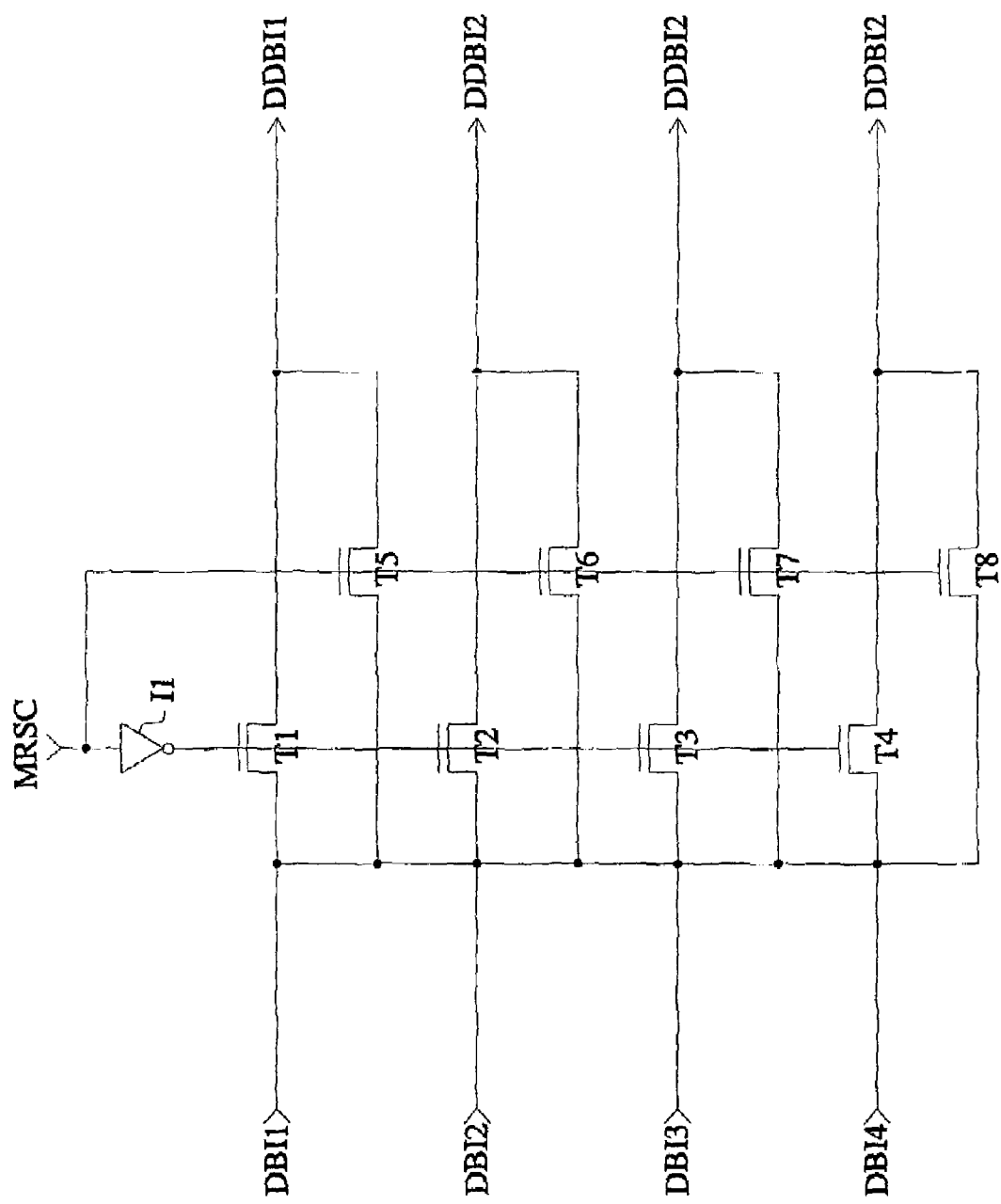
FIG. 4 is a circuit diagram illustrating a write data control circuit of FIG. 3.

FIG. 4 is a circuit diagram of the write data control circuit of FIG. 3. The write data control circuit of FIG. 4 includes an inverter I1, and NMOS transmission gates T1 to T8.

The test control signal MRSC is set to a "high" level during a test operation and to a "low" level during a regular write operation.

During a test write operation, the NMOS transmission gates T5 to T8 are turned on, and the NMOS transmission gates T1 to T4 are turned off. The NMOS transmission gates T5 to T8 transmit buffered input data DBI1 as data DDBI1 to DDBI4. That is, during a test write operation, the buffered input data DBI1 is transmitted as the data DDBI1 to DDBI4.

During a regular write operation, the NMOS transmission gates T1 to T4 are turned on, and the NMOS transmission gates T5 to T8 are turned off. The NMOS transmission gates T1 to T4 transmit buffered input data DBI1 to DBI4 as the data DDBI1 to DDBI4. That is, during a regular write operation, the buffered input data DBI1 to DBI4 are transmitted as the data DDBI1 to DDBI4.

The write data control circuit of FIG. 4 shows a circuit configuration which receives buffered input data DBI1 to DBI4 to generate the data DDBI1 to DDBI4. A circuit configuration which respectively receives buffered input data DBI5 to DBI8, DBI9 to DBI12, and DBI13 to DBI16 to generate data DDBI5 to DDBI8, DDBI9 to DDBI12, and DDBI13 to DDBI16 is the same as FIG. 4.

Therefore, during a regular write operation, the write data control circuit according to the present invention receives 16 bits of buffered input data DBI1 to DBI16 to generate 16 bits of data DDBI1 to DDBI16. During a test write operation, the write data control receives four bits of buffered input data DBI1, DBI5, DBI9, and DBI13 to generate data DDBI1 to DDBI16.

Figure 5:
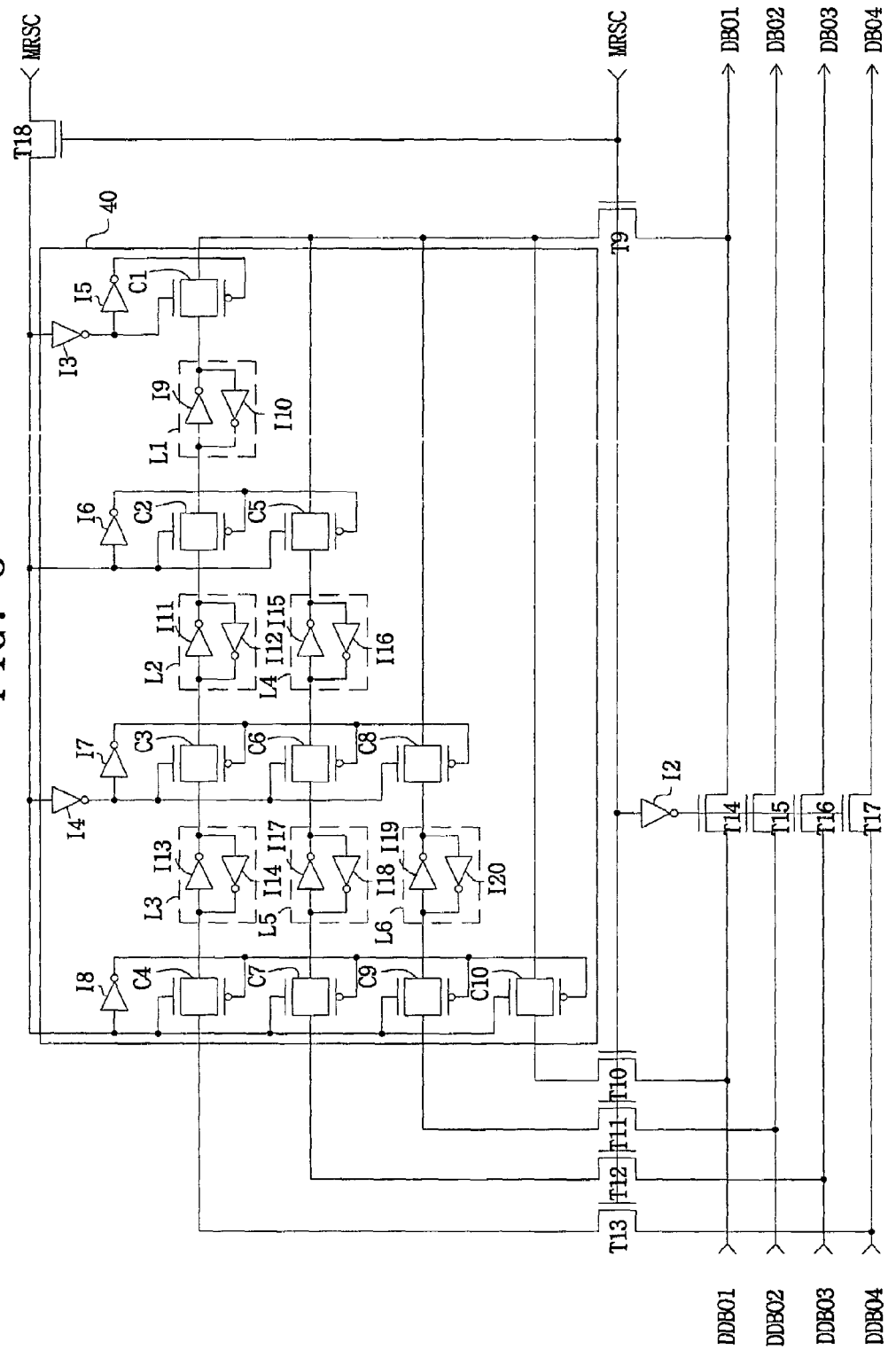
FIG. 5 is a circuit diagram illustrating a read data control circuit of FIG. 3.

FIG. 5 is a circuit diagram illustrating the read data control circuit 32 of FIG. 3. The read data control circuit of FIG. 5 includes inverters I2 to I20, NMOS transmission gates T9–T18, and CMOS transmission gates C1 to C10.

In FIG. 5, two units of inverters I9 and I10, I11 and I12, I13 and I14, I15 and I16, I17 and I18, and I19 and I20 constitute latches L1 to L6, respectively. The inverters I3 to I8, the CMOS transmission gates C1 to C10, and latches L1 to L6 constitute a parallel to serial converting circuit 40.

The test control signal MRSC is set to a "high" level during a test operation and to a "low" level during a regular read operation.

During a test read operation, the NMOS transmission gates T14 to T17 are turned off, and the NMOS transmission gates T9 to T13, and T18 are turned on. Then, the data DDBO1 to DDBO4 are transmitted through the NMOS transmission gates T10 to T13, and a clock signal CLK is transmitted through the NMOS transmission gate T18. The CMOS transmission gate C10 transmits a data transmitted from the NMOS transmission gate T10 in response to the clock signal CLK having a "high" level.

The CMOS transmission gates C9 and C8 and the latch L6 comprise a circuit. The CMOS transmission gate C9 is turned on in response to the clock signal CLK having a "high" level to latch the data DDBO2 to the latch L6. The CMOS transmission gate C8 is turned on in response to the clock signal CLK having a "low" level to transmit a data latched to the latch L6. That is, the circuit comprised of the CMOS transmission gates C9 and C8 and the latch L6 delays the data DDBO2 by a half clock period and then outputs the data.

The CMOS transmission gates C7, C6, and C5 and the latches L5 and L4 comprise a circuit. The CMOS transmission gate C7 is turned on in response to the clock signal CLK having a "high" level to latch a data DDBO3 to the latch L5. The CMOS transmission gate C6 is turned on in response to the clock signal CLK having a "low" level to latch the data latched to the latch L5 to the latch L4. The CMOS transmission gate C5 is turned on in response to the clock signal CLK having "high" level to transmit the data latched to the latch L4. That is, the circuit comprised of the CMOS transmission gates C7, C6, and C5 and the latches L5 and L4 delays the data DDBO3 by a 1.5 clock period and then outputs the data. Similarly, a circuit constituted by the CMOS transmission gates C4, C3, C2, and C1 and the latches L3, L2 and L1 delays the data DDBO4 by 2 clock period and then outputs data. The NMOS transmission gate T9 transmits a data outputted from the parallel to serial converting circuit 40 as data DBO1.

During a regular read operation, the NMOS transmission gates T14 to T17 are turned on, and the NMOS transmission gates T9 to T13 and T18 are turned off. Then, the NMOS transmission gates T14 to T17 transmit the data DDBO1 to DDBO1 as the data DBOL to DBO4. The read data control circuit of FIG. 5 shows only a circuit configuration which receives data DDBO1 to DDBO4 to generate the data DBO1 to DBO4. A circuit configuration, which respectively receives data DDBO5 to DDBO8, DDBO9 to DDBO12, and DDB013 to DDBO6 to generate data DBO5 to DBO8, DBO9 to DBO2, and DBO3 to DBO6, is the same as the circuit configuration of FIG. 5. That is, during a regular read operation, the read data control circuit according to the present invention receives 16 bits of data DDBO1 to DDBO6 to generate 16 bits of data DBO1 to DBO16.

During a test read operation, the read data control circuit converts 16 bits of data DDBO1 to DDBO6 serially to generate four bits of data (DBO1, DBO5, DBO9, and DBO13), (DBO2, DBO6, DBO10, and DBO14), (DBO3, DBO7, DBO11, and DBO15), and (DBO4, DBO8, DBO12, and DBO16) in sequence.

The read data control circuit of FIG. 5 is a circuit configuration, which can be applied to a double data rate (DDR) semiconductor memory device. That is, the read data control circuit of FIG. 5 outputs a data in response to a rising edge and a falling edge of a clock signal.

As described hereinbefore, the semiconductor memory device according to at least one embodiment of the present invention increases the number of the semiconductor memory device that can be tested at the same time by reducing the number of the data I/O pins.

While the present invention has been described in detail with reference to the preferred embodiments, it is to be understood that the invention is not limited to the disclosed embodiments, but, on the contrary, is intended to cover various modifications and equivalent arrangements included within the spirit and scope of the appended claims.

What is claimed is:

1. A semiconductor memory device, comprising:
 a write data controller for receiving predetermined bits of data inputted through data input/output pins to generate plural bits of data, and a read data controller for serially converting the plural bits of data to generate serially converted data through one of the data input/output pins during a test operation; and
 the write data controller for receiving plural bits of data inputted through the input/output pins to generate the plural bits of data, and the read data controller for receiving the plural bits of data to generate the plural bits of data through the data input/output pins during a regular operation,
 wherein the number of the plural bits is N times the number of the predetermined bits, N being a natural number.

2. The device of claim 1, wherein the write data controller comprises transmission gates for transferring the data inputted through the data input/output pins in response to a test control signal.

3. The device of claim 1, wherein the read data controller comprises a parallel to serial converter for serially converting the plural bits of data to generate serially converted data in sequence in response to a test control signal during the test read operation.

4. The device of claim 1, wherein the predetermined bits are four bits and the plural bits are 16 bits.

5. The device of claim 1, wherein the semiconductor memory device is a double data rate (DDR) memory device.

6. The device of claim 3, wherein the test control signal is set by inputting a mode setting code corresponding to the test control signal to a mode setting register during a mode setting operation.

7. A semiconductor memory device, comprising:
a write data controller for receiving n bits of data inputted through data input/output pins to generate n times k bits of data, and a read data controller for serially converting the n times k bits of data by to generate k bits of data to one of the data input/output pins in sequence during a test operation; and
the write data controller for receiving n times k bits of data inputted through data input/output pins to generate the n times k bits of data, and the read data controller for receiving the n times k bits of data to generate n times k bits of data through the data input/output pins during a regular operation,
wherein n and k are natural numbers.

8. The device of claim 7, wherein the write data controller comprises transmission gates for transferring the data inputted through the data input/output pins in response to a test control signal.

9. The device of claim 7, wherein the read data controller comprises a parallel to serial converter for serially converting the n times k bits of data to generate k bits of data in sequence in response to a test control signal during the test read operation.

10. The device of claim 7, wherein the n bits are four bits and the n times k bits are 16 bits.

11. The device of claim 7, wherein the semiconductor device is a double data rate (DDR) memory device.

12. The device of claim 9, wherein the test control signal is set by inputting a mode setting code corresponding to the test control signal to a mode setting register during a mode setting operation.

13. A method of testing a semiconductor memory device, comprising:
extending n bits of data inputted through data input/output pins to generate n times k bits of data, writing the n times k bits of data to a memory cell array, reading the n times k bits of data stored in the memory cell array, and serially converting the n times k bits of data to generate k bits of data, and outputting the k bits of data through one of the data input/output pins during a test operation; and
receiving n times k bits of buffered data inputted through data input/output pins to generate n times k bits of data, writing the n times k bits of data to a memory cell array, reading the n times k bits of data stored in the memory cell array, and receiving the n times k bits of data to generate n times k bits of data, and outputting the n times k bits of data through data input/output pins during a regular operation,
wherein n and k are natural numbers.

14. The method of claim 13, serially converting the n times k bits of data comprises serially converting the n times k bits of data in sequence in response to a test control signal during the test read operation.

15. The method of claim 13, wherein the n bits are four bits and the n times k bits are 16 bits.

16. The method of claim 13, wherein the semiconductor device is a double data rate (DDR) memory device.

17. The method of claim 13 further comprising, inputting a mode setting code corresponding to the test control signal to a mode setting register during a mode setting operation.

* * * * *